United States Patent [19]

Krider et al.

[11] 4,115,732
[45] Sep. 19, 1978

[54] DETECTION SYSTEM FOR LIGHTNING

[75] Inventors: Edmund Philip Krider; Ralph Carl Noggle, both of Tucson, Ariz.; Martin Allan Uman, Gainesville, Fla.

[73] Assignee: The University of Arizona Foundation, Tucson, Ariz.

[21] Appl. No.: 732,365

[22] Filed: Oct. 14, 1976

[51] Int. Cl.² ............................................. G01R 31/02
[52] U.S. Cl. ..................................... 324/72; 324/77 R
[58] Field of Search .................. 73/170 R; 340/172.5, 340/224; 324/72, 72.5, 77 R, 77 A

[56] References Cited

U.S. PATENT DOCUMENTS

| | | | |
|---|---|---|---|
| 3,334,298 | 8/1967 | Krohn | 324/77 A |
| 3,603,951 | 9/1971 | Bracken | 73/170 R |
| 4,023,408 | 5/1977 | Ryan | 324/72 |

*Primary Examiner*—M. Tokar
*Attorney, Agent, or Firm*—Mason, Kolehmainen, Rathburn & Wyss

[57] ABSTRACT

A lightning detection system utilizes a gated magnetic direction finder for determining the range and direction of lightning discharges to ground. Logic circuitry is provided for controlling gating circuits within the direction finder so that the direction measurement is made during the initial few microseconds of the return stroke waveform, thereby minimizing errors caused by non-vertical lightning channels to ground, branches and intracloud discharges. Distance measurements are made by analyzing the amplitude of the detected return stroke waveform, or by utilizing two or more geographically separated direction finders and triangulation techniques. The waveforms of the signals received by the direction finder are analyzed to determine whether the discharge is ground stroke or another type of discharge, or background noise. Further circuitry can be used to distinguish between various types of ground strokes, such as first strokes or subsequent strokes in a flash.

82 Claims, 12 Drawing Figures

FIG. 1
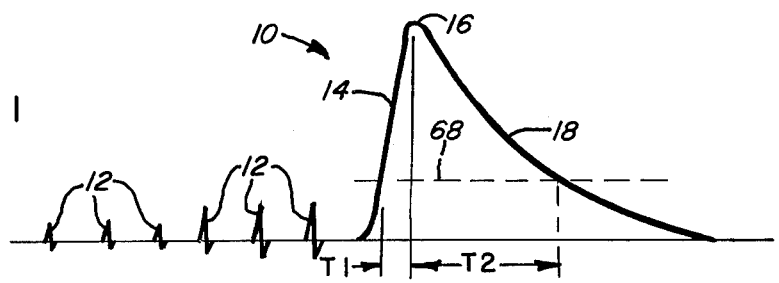
FIG. 2
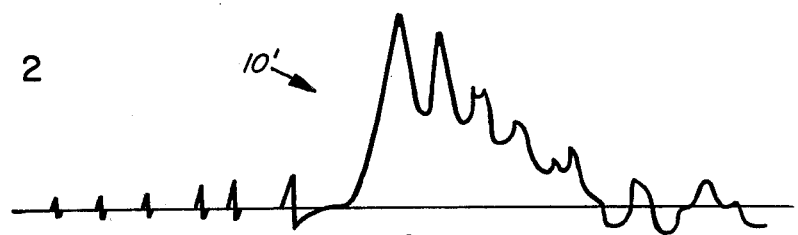
FIG. 3
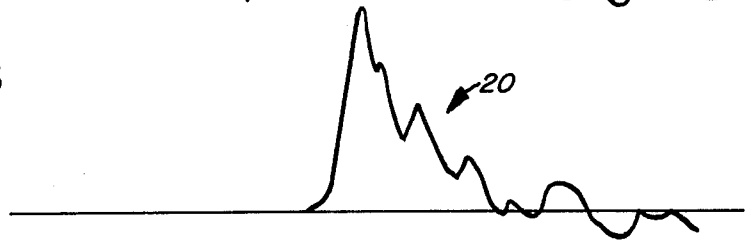
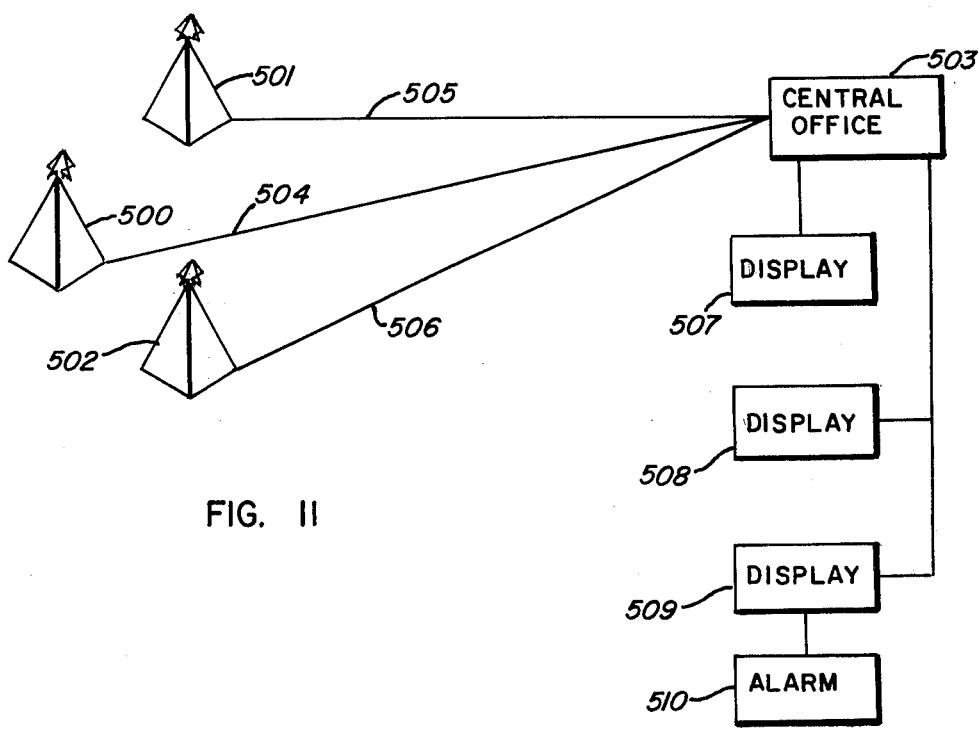
FIG. 11

DETECTION SYSTEM FOR LIGHTNING

BACKGROUND OF THE INVENTION

A. Field of the Invention

The present invention relates generally to detection systems, and more particularly, to a detection system for accurately determining the directions and ranges of lightning discharges to ground.

B. Description of the Prior Art

In many applications, it is often necessary to determine accurate locations of lightning discharges to ground. For example, accurate knowledge of lightning discharges aids in the precise location of forest fires and power system damage, and is useful in providing an indication of the path of an approaching thunderstorm so that recreational areas such as golf courses and swimming pools in the path of the storm may be safely evacuated.

Several systems for locating lightning discharges or thunderstorms are known. One such system employs radar for detecting thunderstorm activity, while another system utilizes a magnetic cathode ray direction finder employing a pair of orthogonal loop antennas tuned to a VLF frequency, typically 10 KHz, for detecting the horizontal magnetic field produced by lightning. The outputs of the orthogonal antennas are simultaneously applied to the X and Y inputs of the X-Y oscilloscope to generate a vector display indicating the direction of the lightning. The intersection of the vectors generated by two geographically spaced direction finders indicates the location of the discharge.

While these systems do provide a way to detect the presence of thunderstorm activity, radar systems do not detect lightning discharges directly, but rather detect precipitation and the presence of clouds. However, the presence of precipitation or clouds is not, by itself, an accurate indication of the presence of lightning, because many large clouds may produce little or no lightning, while a single small cloud may produce severe lightning discharges to ground.

Magnetic cathode ray direction finders detect lightning discharges directly, but the accuracy of conventional cathode ray direction finders is poor at distances of less than about 200 km because antennas sense not only the magnetic field from the vertical channel, but also the fields produced by horizontal channel sections and by ionospheric reflections. Also, these systems are subject to site errors due to their narrow bandwidths. These effects result in bearing errors in excess of 20° at distances of about 200 km, with the errors growing substantially larger for distances of less than 200 km. Furthermore, the prior art systems are unable readily to discriminate between ground strokes and intracloud discharges.

SUMMARY OF THE INVENTION

Accordingly, it is an object of the present invention to provide an improved lightning detection system that overcomes many of the disadvantages of the prior art systems.

It is yet another object of the present invention to provide an improved lightning detection system that provides a more accurate indication of the bearing of lightning strokes than do prior art systems.

It is still another object of the present invention to provide an improved lightning detection system that can discriminate between ground strokes, intracloud discharges and sources of background noise.

It is still another object of the present invention to provide a lightning discharge direction finder that determines the location of a ground stroke with an angular accuracy that does not change appreciably with range.

In accordance with a preferred embodiment of the invention, two vertical and orthogonal wide band magnetic field antenna elements are used to detect the horizontal component of the magnetic field produced by lightning discharges. The output of each antenna element being a time derivative of one of the horizontal components of the magnetic field, is integrated to restore the original magnetic field waveform and applied to a track and hold circuit, either directly or through a second integrator. In addition, a peak detecting circuit determines the occurrence of the peak of the signal detected by the antennas, and a comparison circuit compares the amplitude of the received signal with a predetermined threshold level. If the received signal reaches its peak within a predetermined time interval, and remains above the threshold level in excess of a predetermined time period, a logic circuit indicates that a valid ground stroke has occurred and displays the contents of the track and hold circuit on a display device such as an X-Y oscilloscope or a plotter to determine the direction of the strike. Circuitry responsive to the amplitude of the detected signal may be used to provide an indication of range, or the bearings provided by multiple geographically spaced receiving stations may be triangulated to determine range. The logic circuitry is capable of further analyzing the waveform of the received signal to further classify each lightning stroke, and to average the range and direction readings of each stroke in a lightning flash to ground.

DESCRIPTION OF THE DRAWINGS

These and other objects and advantages of the present invention will be readily understood by reference to the following detailed description and attached drawings, wherein:

FIGS. 1-3 show the waveforms of signals produced by typical lightning strokes to ground;

FIG. 11 is a block diagram of an embodiment of the system according to the invention utilizing multiple direction finders to provide more accurate location information.

DETAILED DESCRIPTION OF THE PREFERRED EMBODIMENT

I. Theory of Operation

Figure 4:
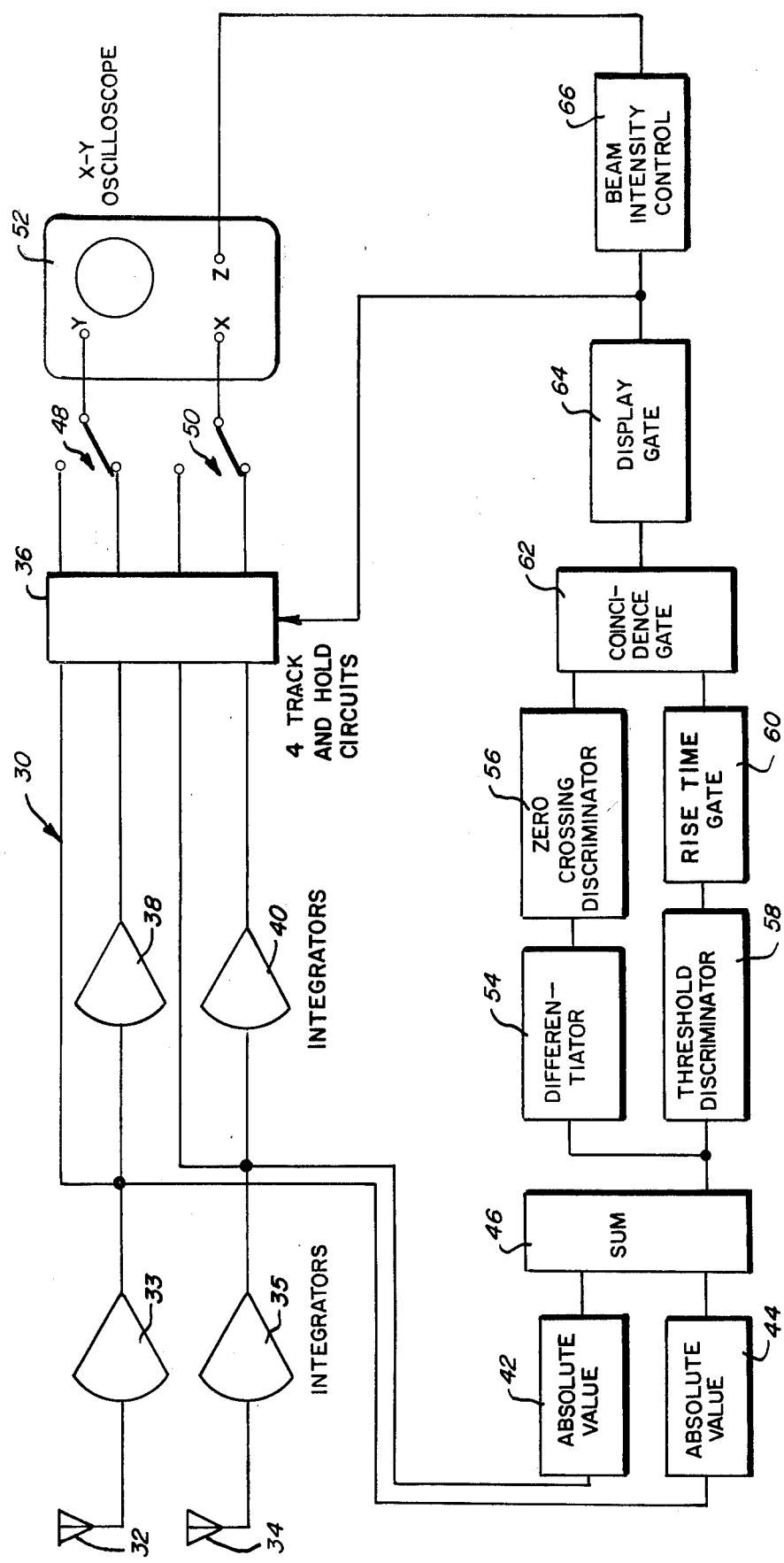
FIG. 4 is a generalized block diagram of a simple embodiment of the direction finder according to the invention.

In order to understand the operation of the lightning detection system according to the present invention, the mechanism of lightning generation must first be understood. A typical lightning flash to ground is made up of several component strokes. A discharge starts with a faint stepped leader which proceeds rather slowly from cloud to ground in a series of short luminous steps generating an ionized path along its path of travel. When the stepped leader contacts the ground, a bright, high energy, return stroke propagates rapidly up the ionized path established by the stepped leader. After a pause of 30 to 50 milliseconds, a new leader, known as a dart leader proceeds uniformly from the cloud to ground and is followed by another bright upwardly propagating return stroke. A typical lightning flash to ground is made up of three or four leader-return stroke combinations. Typical return strokes have very high peak currents, usually in the range of 20,000 to 40,000 amperes.

Through much experimentation, the inventors have found that as the return stroke propagates upward, the portion of the return stroke near the ground is relatively straight and nearly vertical with none of the large branches or horizontal sections that typically occur as the return stroke continues to propagate toward the cloud. Accordingly, if only the field produced by the relatively vertical component near the ground is used to determine the direction of the stroke, a much more accurate measurement of the direction of the stroke results.

A ground stroke of the type described in the foregoing generates a magnetic field which, when detected by one of the antennas used with the detector of the present invention, provides a waveform similar to the waveform 10 illustrated in FIG. 1. The actual waveform is somewhat more complicated as a result of the multiple reflections and other phenomena, and is actually more like the waveform 10' illustrated in FIG. 2. The waveform 10 illustrated in FIG. 1 has been simplified for purposes of clarity and to illustrate the relatively fast rise time and exponential decay of the detected waveform generated by a ground stroke.

In general, as the stepped leader progresses down, from the cloud to ground, a series of relatively low amplitude spikes 12 (FIG. 1) are generated, each such spike being generated by a respective step in the downwardly progressing steps of the stepped leader. Typically, the spikes 12 occur at 20 to 50 microsecond intervals. After the stepped leader reaches the ground, the return stroke is evidenced by a rapid rise 14 in the waveform 10 that rapidly reaches a peak value 16 and decays along an exponential curve 18. In a typical stroke, the rise time $t_1$ ranges from 1 to 15 microseconds and the time constant $t_2$ of the exponential decay 18 is approximately 20 to 40 microseconds. As previously described, subsequent return strokes in the same flash are preceded by a dart leader rather than a stepped leader, and hence, no spikes similar to the spikes 12 precede the waveform 20 (FIG. 3) generated by a subsequent return stroke. Also, the decay portion of a subsequent stroke waveform lacks the large secondary peak characteristic of a first return stroke.

The rapid rise to a relatively high peak characterizes the beginning of each return stroke to ground, while intracloud strokes have waveforms similar to those of stepped leaders, and do not exhibit such a rapid rise nor such a high peak. These waveforms may also have fast rise time spikes superimposed on a slow rise, and thus bear some resemblance to a return stroke signal. However, by utilizing circuitry for rejecting the spikes and by making the system responsive only to a signal having the rapid rise to a peak and the exponential decay characterizing the beginning of a ground return stroke, and by making direction measurements only during the initial portion of the return stroke characterized by the rapid rise and exponential decay, only the direction of the relatively straight and vertical lower portion of the return stroke is measured. If only the initial peak is used to obtain directional information, a true indication of the direction of a ground return stroke will result, and the system will not be triggered by intracloud flashes or certain classes of background noise, nor will it be affected by the subsequent branching and horizontal portions of the return stroke. A further analysis of the waveform may be made, as is described in a subsequent portion of the specification, to further classify various types of lightning discharges.

II. General

Referring now to FIG. 4, there is illustrated a generalized block diagram of the lightning detection system according to the invention generally designated by the reference numeral 30. The detection system 30 utilizes a pair of orthogonally positioned antennas 32 and 34, which, in a preferred embodiment, may be magnetic field detecting loop antennas such as those described in Krider, et al., "Broadband Antenna Systems for Lightning Magnetic Fields", *Journal of Applied Meteorology*, Vol. 14, No. 2, March 1975, pp. 252–256. The plane of the antenna 32 is positioned to face, for example, in a north-south direction, and the plane of the antenna 34 is positioned to face, for example, in an east-west direction. Consequently, the antenna 32 receives the north-south component of the magnetic field of any lightning discharge, and the antenna 34 receives the east-west component.

The outputs of the antennas 32 and 34, which are proportional to the time derivative of the received magnetic field signals, are integrated by a pair of respective integrators 33 and 35, and applied to a track and hold circuit 36 either directly, or through a second pair of respective integrators 38 and 40. In addition, the outputs of the integrators 33 and 35 are applied to a pair of absolute value circuits 42 and 44 that provide a constant polarity signal proportional to the amplitude of the signal received by the respective one of the antennas 32 and 34 to a summing circuit 46.

A pair of switches 48 and 50 couple the output of the track and hold circuit 36 to a display unit such as, for example, an X-Y oscilloscope 52. The output of the summing circuit 46 is applied to a differentiator 54 which drives a zero crossing discriminator 56 and to a threshold discriminator 58 that drives a risetime gate 60. The outputs of the zero crossing discriminator 56 and the risetime gate 60 are applied to a coincidence gate 62 which drives a display gate 64. The output of the display gate 64 controls the track and hold circuit 36 and a beam intensity control 66 that in turn controls the beam intensity of the X-Y oscilloscope 52 in order to blank the beam of the oscilloscope 52 when a sample is not being displayed.

The integrators 38 and 40 serve to integrate the signals from the respective integrators 33 and 35. The integrated and nonintegrated signals from the integrators 33 and 35 are received by the track and hold circuit 36 which tracks each of the integrated and nonintegrated signals and provides output signals proportional to the instantaneous magnitudes of each of the input signals upon receipt of a display signal from the display gate 64. The switches 48 and 50 select the signals corresponding to the integrated or non-integrated signals for application to the X and Y inputs of the X-Y oscilloscope 52.

The rest of the circuitry serves to control the application of the received signals to the oscilloscope 52. In the present embodiment, the absolute values of the received signals are summed by the summing circuit 46 which provides an output signal proportional to the amplitude of the combined signal received by the antennas 32 and 34. When the signal from the summing circuit 46 reaches a predetermined level determined by the threshold discriminator 58, the threshold discriminator 58 provides a signal to the risetime gate 60 which, in turn, enables the coincidence gate 62 for a predetermined time interval (usually 5 to 10 microseconds) after the threshold is exceeded. The differentiator circuit 54 provides an output signal proportional to the slope of the signal from the summing circuit 46. When the signal from the summing circuit reaches a peak, its slope is zero, and hence, the output of the differentiator 54 is zero (corresponding to the peak 16 of FIG. 1). The zero output from the differentiator 54 is detected by the zero crossing discriminator 56 which provides a signal to the coincidence gate 62 when the received signal reaches its peak. If the signal from the zero crossing discriminator 56 is received by the coincidence gate 62 during the 5 to 10 microsecond enabling pulse from the risetime gate 60, the coincidence gate 62 will trigger the display gate 64 which will increase the beam intensity of the X-Y oscilloscope 52 and cause the contents of the track and hold circuit 36 to be displayed.

As can be seen from the foregoing, in order for a received signal to be displayed on the X-Y oscilloscope 52, the received signal must have a characteristic similar to the waveform illustrated in FIG. 1. The peak 16 of the signal must exceed a predetermined amplitude 68 determined by the threshold discriminator 58. Furthermore, the peak 16 of the waveform must occur within the time interval set by the risetime gate 60, for example, $t_1$ must be less than the typical 5 to 10 microsecond window provided by the rise-time gate 60. As a result, only waveforms characteristic of a ground stroke are displayed on the oscilloscope 52 and other waveforms are ignored.

The outputs of the integrators 33 and 35 may be sampled directly and displayed on the oscilloscope 52, or the outputs may be integrated by the integrators 38 and 40 prior to sampling and display. The second integrators are particularly useful when distant storms (over 200 kilometers) are being monitored since the integrators provide an effective rejection of high frequency background noise. Finally, since the peak of most ground strokes is reached within 10 microseconds after the threshold 68 is exceeded, the threshold discriminator 58 can be used to operate a 10 microsecond delay circuit which would actuate the display gate 54 to cause the display of the received waveform approximately 10 microseconds after the threshold 68 is exceeded. However, it has been found that the system illustrated in FIG. 4, wherein the received signal is displayed at or just after the exact peak of the received waveform, provided that that peak occurs within the 10 microsecond window interval, provides better rejection of spurious signals such as intercloud and intracloud discharge signals that have a peak that typically occurs more than 10 microseconds after the threshold is exceeded.

While the circuit illustrated in FIG. 4 incorporates the basic concepts of the present invention, such a circuit must be operated by trained personnel, and the display provided requires interpretation. Accordingly, an automatic circuit (FIG. 5) that can be operated by relatively unskilled personnel has been developed. In the circuit illustrated in FIG. 5, signals from antennas 132 and 134, analogous to the antennas 32 and 34, are applied to respective high gain and low gain analog circuits 136 and 138 through a pair of respective filters 140 and 142. As in the previous embodiment, the filters 140 and 142 serve to attenuate extraneous signals, and the use of the high gain and low gain analog circuits 136 and 138 extends the dynamic range and sensitivity of the system. The output of the high gain analog circuit 136 is used when distant storms are being monitored, and if the output of the high gain analog circuit 136 exceeds a predetermined level, the output of the low gain analog circuit 138 is automatically selected. Each of the high and low gain analog circuits 136 and 138 contains integrators, absolute value circuits, track and hold circuits and peak detecting circuitry similar to that illustrated in FIG. 4. The high gain analog and low gain analog circuits are discussed in greater detail in a subsequent portion of the specification.

The outputs of the high gain and low gain analog circuits 136 and 138 are applied to separate high gain logic and low gain logic circuits 143 and 144, respectively. The high gain and low gain logic circuits 143 and 144 select only those pulses that have rise times and widths characteristic of return strokes. The peak values of the selected waveforms are held in a track and hold circuit within one of the high gain or low gain analog circuits 136 and 138, and may be subsequently digitized by a micro-processor 146, such as, for example, an INTEL 8080. The detected peak values may be applied to the micro-processor 146 or directly to an X-Y plotter control circuit 152 via a micro-processor interface 148. The detection electronics including the antennas 132, 134, the filters 140, 142 and the high gain and low gain analog circuits 136 and 138 respond to each stroke in a given lightning flash, and, when used, the micro-processor can be programmed to store the signals from all of the component strokes in each flash until the discharge is over. The micro-processor may also be utilized to test the data produced by various strokes from each flash for mutual consistency, and to provide an indication of direction and a range estimate based on the average mutually consistent direction and the average signal. The average angle and range are displayed on an X-Y plotter 150 that is controlled by the plotter control 152. In addition, the direction and range information may be transmitted to a central location via a data communications system utilizing a standard serial teletype format so that information from several sites may be analyzed at a central location, and so that the location of each strike can be more accurately determined utilizing triangulation techniques.

The micro-processor 146 can determine the time of each flash from a digital clock 154, and the output of the micro-processor 146 may be read on a digital front panel display 156. An X axis zero shift circuit 158 controls the plotter control 152 to shift the position of the display provided by the plotter 150. A test pulse circuit 160 is used to calibrate the circuit and to determine whether it is operating properly.

III. Analog Circuitry

Figure 6:
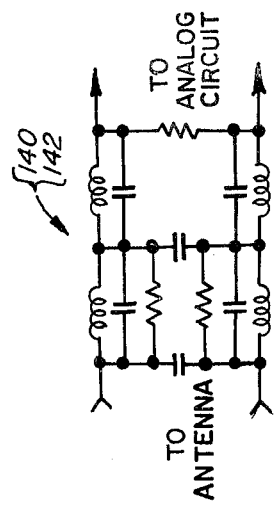
FIG. 6 is a schematic diagram of a filter usable for the antenna filters 140 and 142 of FIG. 5.
Figure 7:
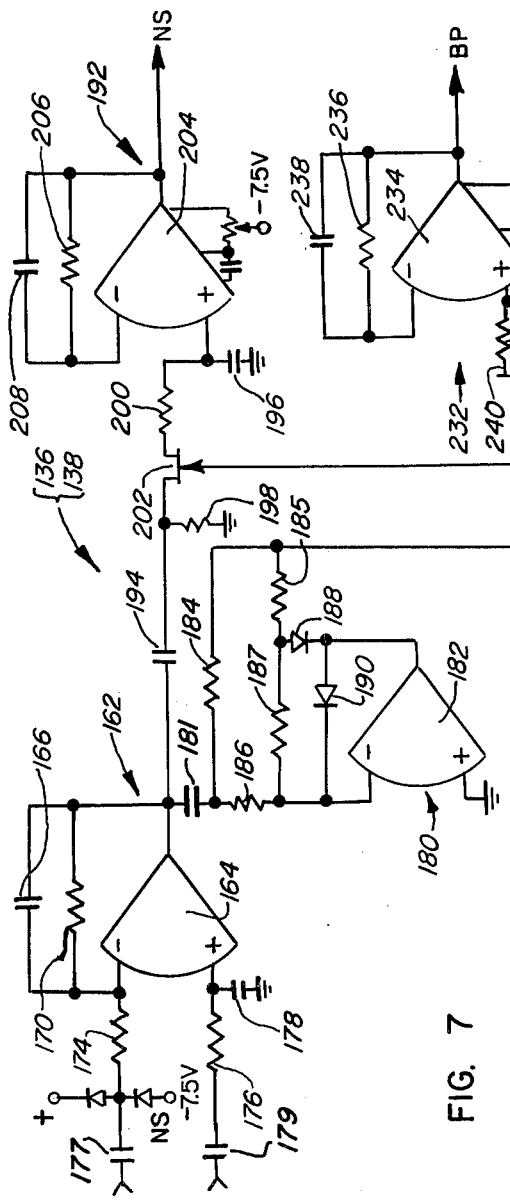
FIG. 7 is a detailed schematic diagram of an analog circuit usable for the analog circuits 136 and 138 of FIG. 5.

A circuit usable for each of the high and low gain analog circuits 136 and 138 is illustrated in FIG. 7. The analog circuits 136 and 138 are connected to the antennas by the antenna filters 140 and 142 illustrated in greater detail in FIG. 6. As can be seen from FIG. 6, the antenna filters 140 and 142 comprise standard balanced $m$-derived and constant $k$ low pass filters selected to reject frequencies above approximately 500–700 kHz, in order to attenuate radio and other extraneous signals to prevent these signals from affecting the measurement. The resistors shown broaden the notch response of the filter and avoid ringing of fast signals.

Similar circuits may be used for the high and low gain analog circuits 136 and 138 (FIG. 7) provided that appropriate gain adjustments are made to the circuit. The circuit illustrated in FIG. 7 includes an integrator 162 comprising an operational amplifier 164 and a feedback network including a capacitor 166 and a resistor 170. The output of the filter 142 connected to the north-south antenna 134 is connected to the inputs of the differential amplifier 164 via an input network comprising a pair of resistors 174 and 176 and capacitors 177, 178 and 179. The output from the integrator 162 is applied through a capacitor 181 to an absolute value circuit 180 comprising an operational amplifier 182 and a feedback network comprising four resistors 184–187 and a pair of diodes 188 and 190. The absolute value circuit serves to provide a constant polarity output signal proportional to the amplitude of the signal received from the integrator 162, regardless of the polarity of the signal received.

The output of the integrator 162 is also applied to a north-south hold follower 192 via a coupling network comprising capacitors 194 and 196, resistors 198 and 200, and a bilateral transmission gate 202. The north-south hold follower utilizes an operational amplifier 204 and a feedback network comprising a resistor 206 and a capacitor 208 and provides an output signal N–S proportional to the magnitude of the output from the integrator 162 at the time that the sample is taken in response to a sampling signal S received from the logic circuit 136 or 138.

An integrator 162', similar to the integrator 162, having analogous components designated by like primed numbers, receives and integrates a filtered signal from the east-west antenna 132. The integrated signal from the integrator 162' is applied to a second absolute value circuit 180' similar to the absolute value circuit 180 and to an east-west hold follower 192', similar to the north-south hold follower 192 through a gating circuit including a field effect transistor 202', capacitors 194' and 196' and resistors 198' and 200'. The hold follower 192' provides an output signal E–W proportional to the east-west component of the detected magnetic field at the time the sample is taken under the control of the sampling signal S.

In order to determine the peak of the detected waveform, the outputs of the absolute value circuits 180 and 180' are summed by a summing circuit 210 comprising an operational amplifier 212 and a variable feedback resistor 214. The output of the summing circuit 210, which represents the sum B of the east-west and north-south components of the detected magnetic field, is then applied to a differentiating circuit 216 through a coupling network including a capacitor 218 and a resistor 220. The differentiator 216, comprising an operational amplifier 222 and associated feedback circuitry including a resistor 224, a capacitor 226 and a pair of diodes 228 and 230, provides an output signal DB which is zero when the slope of the output signal from the summing circuit 210 is zero, indicating a peak of the detected waveform.

In addition, the output of the summing circuit 210 is applied to a peak amplitude sensing hold follower 232, similar to the hold followers 192 and 192' and comprising an operational amplifier 234, a feedback network including a resistor 236, a capacitor 238 and associated circuitry. A gating circuit including a bilateral transmission gate 240, controlled by the sampling signal S from one of the logic circuits 143 and 144, a resistor 242 and a capacitor 244 is used to gate the signal from the summing circuit 210 into the hold follower 232 to cause the hold follower 232 to provide an output signal BP proportional to the peak of the combined east-west and north-south components of the detected signal which may be used to estimate the range to the lightning stroke.

IV. Logic Circuits

Figure 8:
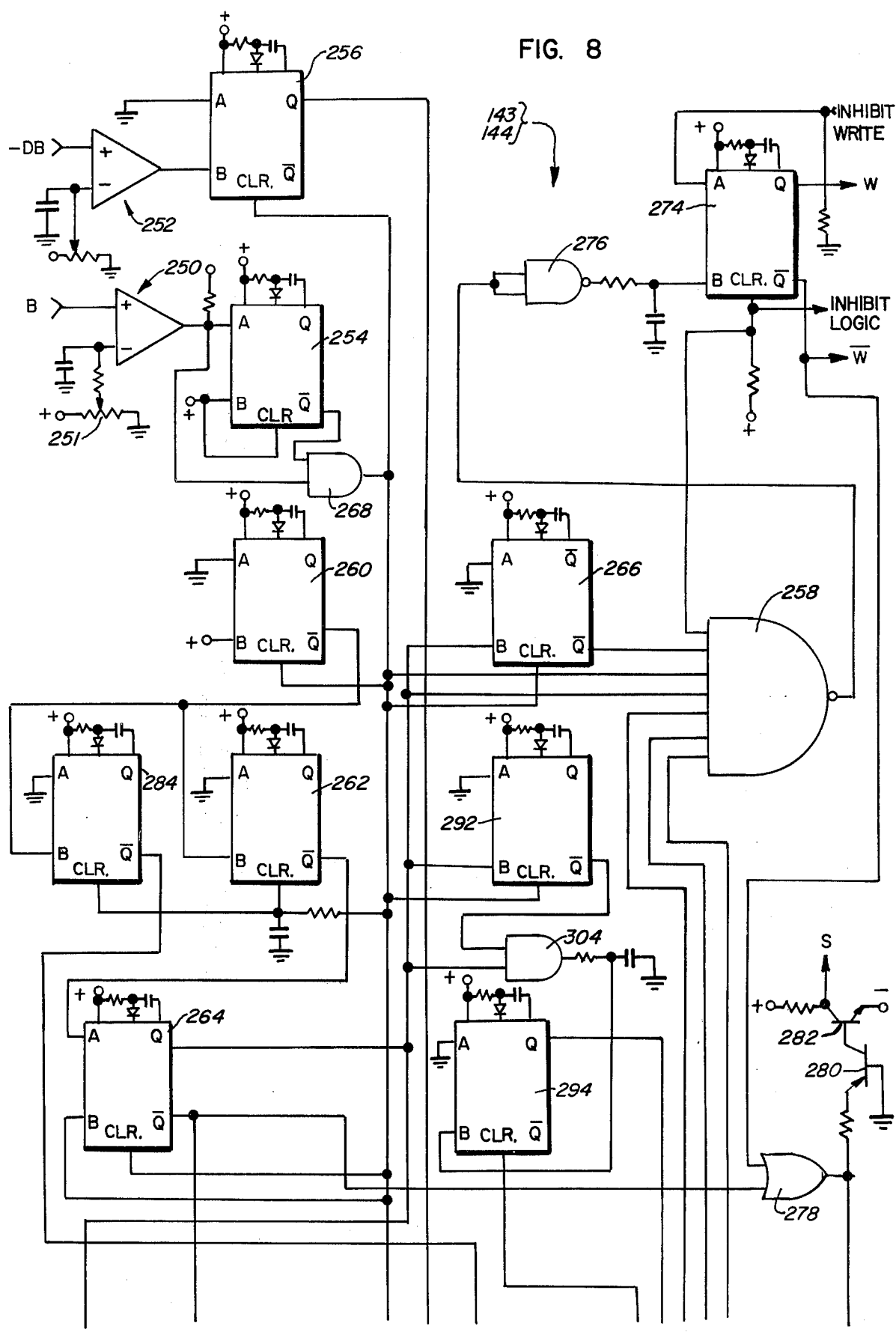
FIG. 8 is a detailed schematic diagram of a logic circuit usable as the logic circuits 143 and 144.
Figure 8:
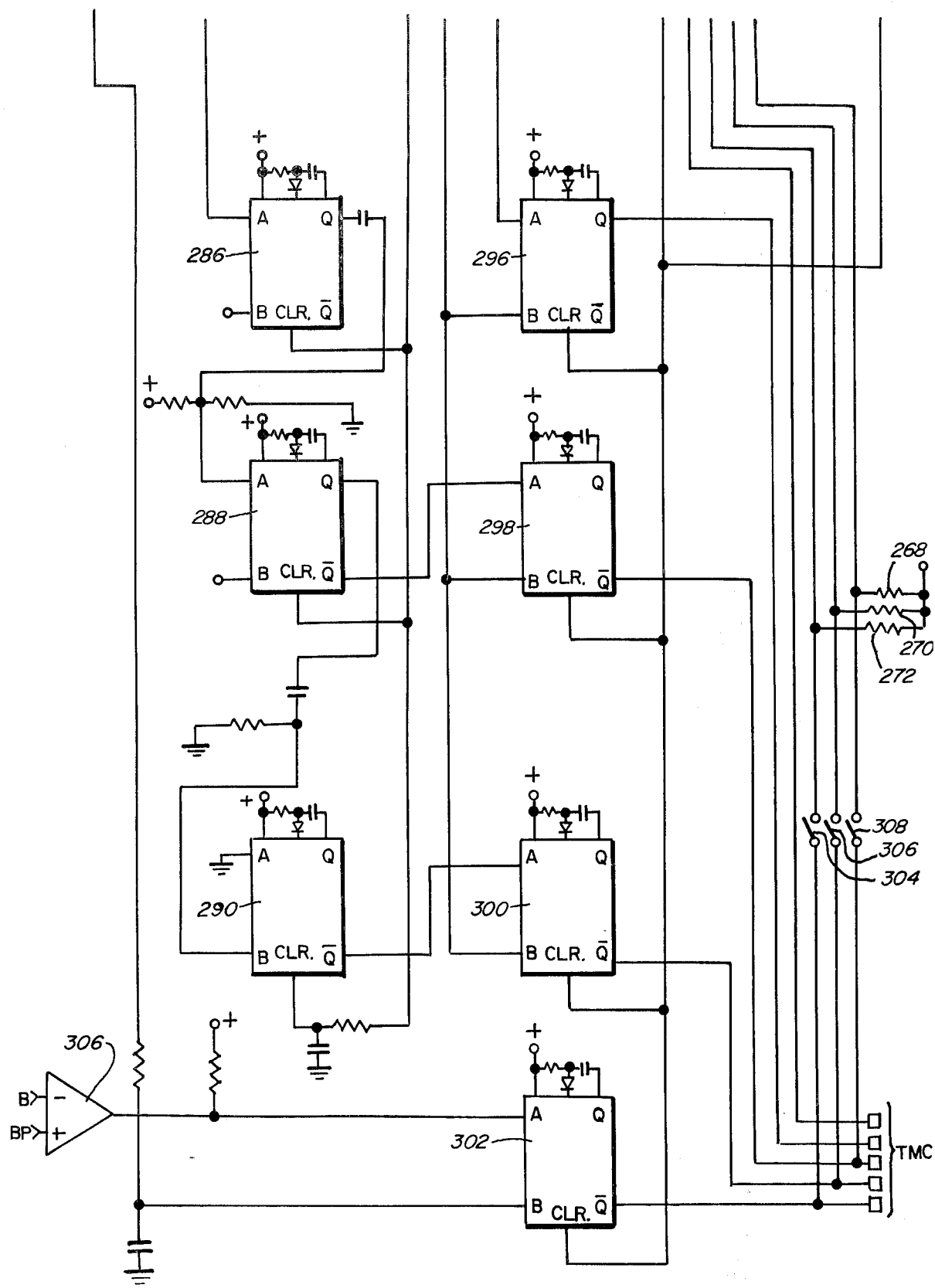

The function of the logic circuit 143 or 144 illustrated in FIG. 8 is to perform various tests on the detected waveforms to determine whether the detected waveform was generated by a ground stroke. First, the peak of the detected waveform is examined to determine its magnitude, rise time and duration. If a second peak is present, the position and magnitude of the second peak may also be examined. In order for a waveform to be a valid indication of a ground stroke, the second peak, if present, must be smaller than the first peak and occur within a predetermined time interval following the first peak.

A threshold discriminator 250 is used to determine whether the peak of the detected waveform B (from one of the analog circuits 136 or 138) applied to its input from the output of the summing circuit 210 (FIG. 7) exceeds a predetermined level determined by a potentiometer 251. The location of the peak is determined by a zero crossing discriminator 252 that senses the zero crossing of the inverted DB output of the differentiator 216. The threshold can be made nonzero to require that the peak be sharp. The output of the threshold discriminator 250 enables an AND gate 268 and triggers a monostable multivibrator 254 that applies a 500 nanosecond disabling signal to the AND gate 268 to disable the gate for a period of approximately 500 nanoseconds after the B signal from the summing circuit 210 drops below the threshold level. This serves to insure that all logic circuitry is properly reset when the absolute value of the signal drops to zero, no matter how fast the zero crossing of the original signal might be, and also serves to keep the system from being locked up by pulses occurring in bursts of less than 500 nanosecond spacings.

Upon threshold crossing of the B signal, the output of the AND gate 268 enables a monostable multivibrator 256 in preparation of the detection of the peak of the signal by the zero crossing discriminator 252. Simultaneously, the output of the AND gate 268 enables a NAND gate 258 and triggers a monostable multivibrator 260.

The monostable multivibrator 260 generates a one microsecond duration pulse that triggers a 9 microsecond monostable multivibrator 262 which, in turn, enables sampling monostable multivibrator 264 for the period from 1 to 10 microseconds following the generation of the enabling signal by the AND gate 268.

Upon detection of the peak of the detected waveform by the zero crossing discriminator 252, the monostable multivibrator 256 will provide a pulse to the monostable multivibrator 264. If this pulse occurs within the 10 microseconds (in the present embodiment) after the waveform has exceeded the threshold determined by the potentiometer 251, the monostable multivibrator 264 will provide an enabling pulse having a pulse width of approximately 70 microseconds to the NAND gate 258. The pulse from the monostable multivibrator 264 is also applied to one input of an OR gate 278, the output of which causes a pair of transistors 280 and 282 to generate a sampling pulse S for application to the track and hold circuits of the analog circuit (FIG. 7). Simultaneously, the output of the monostable multivibrator 264 triggers a short width monostable multivibrator 266 that provides a disabling signal to the NAND gate 258 for a period of time that is adjustable from 0 to 50 microseconds following the detection of the peak. This disabling signal prevents the gate 258 from being fully enabled unless the duration of the detected magnetic pulse exceeds the duration of the pulse provided by the monostable multivibrator 266. Consequently, detected waveforms having a duration less than the duration of the output from the monostable multivibrator 266 do not cause the NAND gate 258 to generate an output pulse.

In the basic system according to the invention, enabling signals are also applied to the NAND gate 258 from a source of positive potential through three resistors 268, 270 and 272 so that a pulse is generated by the NAND gate 258 if the detected waveform exceeds the predetermined threshold, reaches its peak within a predetermined time (10 microseconds in this embodiment) and has a duration of 0 to 50 microseconds. This pulse is applied to a write monostable multivibrator 274 via a NAND gate 276 connected as an inverter. The write monostable multivibrator 274 generates a write pulse W which initiates the display of the data, and also generates an inverted write pulse $\overline{W}$ that is applied to one input of an OR gate 278 together with the $\overline{Q}$ output of the monostable multivibrator 264 to cause a pair of transistors 280 and 282 to prolong the sampling pulse S for the duration of the write pulse. The control provided by the write signal will be further discussed in a subsequent portion of the specification.

Besides making the basic tests described above on the received waveforms, it is sometimes desirable to make further tests on the waveform so that the lightning strokes may be classified into various types. This classification is done by a plurality of monostable multivibrators 284, 286, 288, 290, 292, 294, 296, 298, 300 and 302 and associated circuitry which generate a trigger mode code TMC to indicate the various classifications of waveforms. In addition, various ones of the trigger mode code TMC outputs may be applied to various inputs of the NAND gate 258 through switches 304, 306 and 308 and used to inhibit or enable the gate 258 when certain characteristics occur, thereby further increasing the ability of the circuit to discriminate against undesired waveforms.

For example, it may be desirable to identify waveforms having a relatively short rise time. Accordingly, a short rise time monostable multivibrator 284 is used to generate a pulse that lasts for 6 microseconds after the threshold determined by the potentiometer 251 is exceeded. This pulse is applied to a monostable multivibrator 296 which also receives the peak indicative output pulse from the monostable multivibrator 256; and if the pulse from the multivibrator 256 occurs during the time during which the multivibrator 296 is enabled by the multivibrator 284, an output pulse is generated by the multivibrator 296 to indicate a waveform having a rise time of at least 6 microseconds has been detected.

A long width monostable multivibrator 292 that has an output pulse having an adjustable duration ranging from 0 to 50 microseconds (in this embodiment) has an output applied to an AND gate 304 that has a second input connected to the output of the sampling multivibrator 264. The output of the multivibrator 292 disables the gate 304 for a time corresponding to the minimum width a pulse must have to be considered a long width pulse. The monostable multivibrator 264 will apply an enabling pulse to the gate 304 whenever the amplitude of the detected waveform is above the threshold set by the potentiometer 251, and if this enabling pulse is present after the long width discriminator 292 times out, the gate 304 will trigger the monostable multivibrator 294 to provide a TMC pulse indicating that the detected waveform had a width longer than the width of the pulse provided by the monostable multivibrator 292.

The monostable multivibrators 286, 288 and 290, in conjunction with the monostable multivibrators 298 and 300 evaluate any second peak that may be present on the detected waveform and determine whether the time interval between the first and second peaks corresponds to the time interval between peaks of a proper ground stroke waveform. The output of the monostable multivibrator 264 triggers the monostable multivibrator 288 through a delay monostable multivibrator 286. The multivibrator 288 provides a 5 microsecond duration enabling pulse to the monostable multivibrator 290 so that if a second peak, as indicated by the output of the monostable multivibrator 256, occurs within 5 microseconds after the triggering of the monostable multivibrator 264 by the first peak, the monostable multivibrator 298 will generate an output signal which will appear at the trigger mode code TMC indicating that the second peak has occurred too soon for the detected waveform to represent a ground stroke. If desired, the $\overline{Q}$ output of the monostable multivibrator 298 may be applied to an input of the NAND gate 258 through the switch 308 to disable the NAND gate 258, thereby inhibiting the write pulse under such conditions.

After the monostable multivibrator times out, the trailing edge of the generated output pulse triggers the monostable multivibrator 290 which enables the monostable multivibrator 300 for a period of 12 microseconds (in this embodiment) after the timing out of the multivibrator 288. Consequently, if a second peak is detected by the zero crossing discriminator 252 within 5 to 17 microseconds after the detection of the first peak, the monostable multivibrator will provide a signal indicating that the location of the second peak is within the expected range, thereby indicating a lightning stroke to ground. If the Q output of the monostable multivibrator 300 is applied to one of the inputs of the NAND gate 258 through the switch 306, the gate 258 will be enabled only if the second peak occurs within the proper time interval after the first peak thereby allowing a write pulse to be generated. If the second pulse occurs too late, the monostable multivibrator 290 will time out, thereby causing the multivibrator 300 to inhibit the NAND gate 258.

As previously discussed, the magnitudes of subsequent peaks may be evaluated to determine whether the detected waveform has the characteristics associated with a ground stroke. Accordingly, a comparator 306 is employed to compare the peak value BP of the detected waveform from the track and hold circuit to the instantaneous value of the detected waveform as represented by the value B. If the present value of B exceeds the peak value BP, the monostable multivibrator 302 is triggered to provide trigger mode code TMC indicating that the second peak is higher than the first peak. If the $\bar{Q}$ output of the monostable multivibrator 302 is connected to the NAND gate 258 through a switch 304, the $\bar{Q}$ output will inhibit the gate 258 when the second peak exceeds the amplitude of the first peak, thereby inhibiting the generation of a write pulse. This serves to reject the previously described intracloud discharge signals of the type that have fast spikes superimposed on a slow rise.

V. Plotter Control

Figure 5:
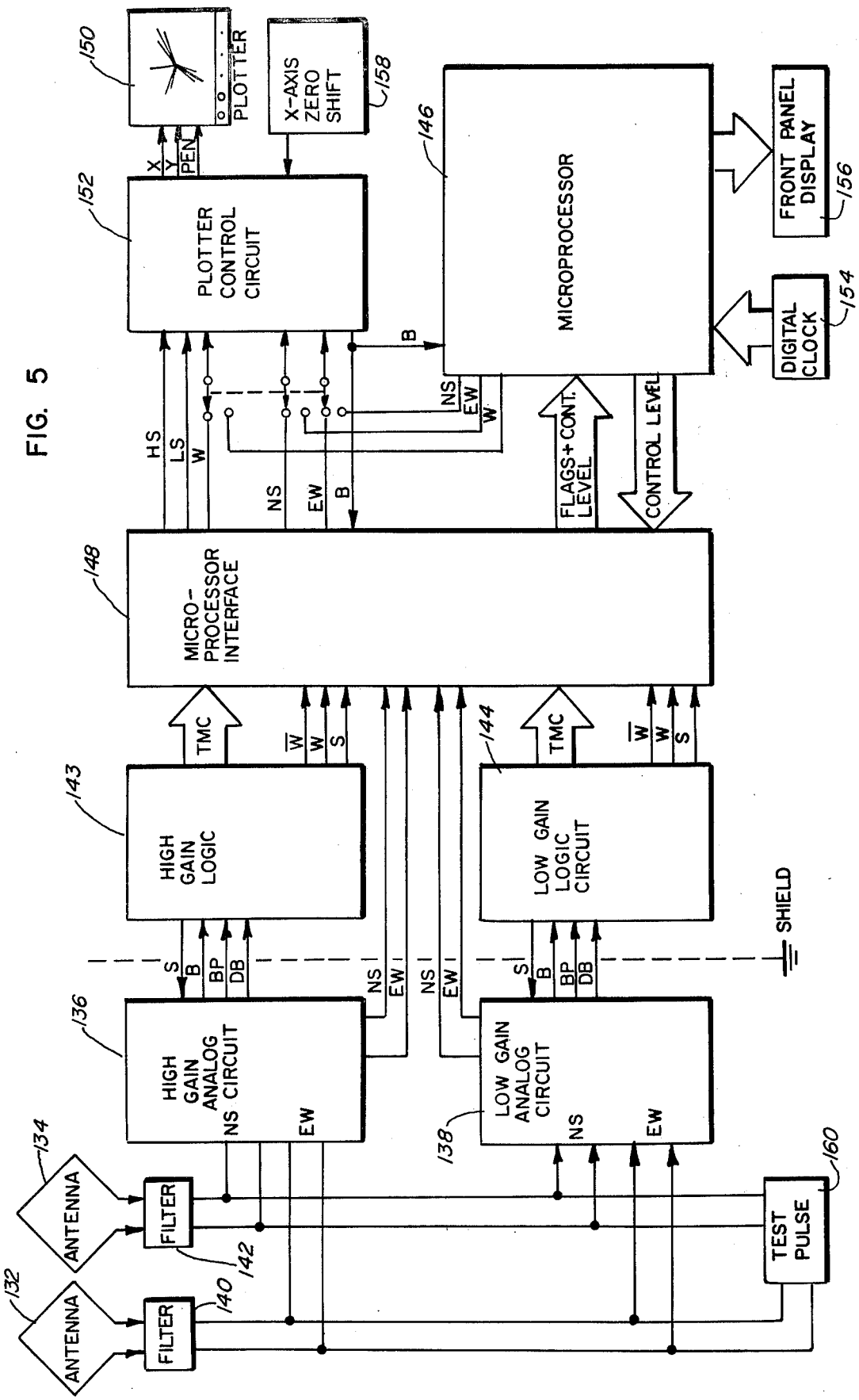
FIG. 5 is a generalized block diagram of an automatic version of the direction finder according to the invention.
Figure 9:
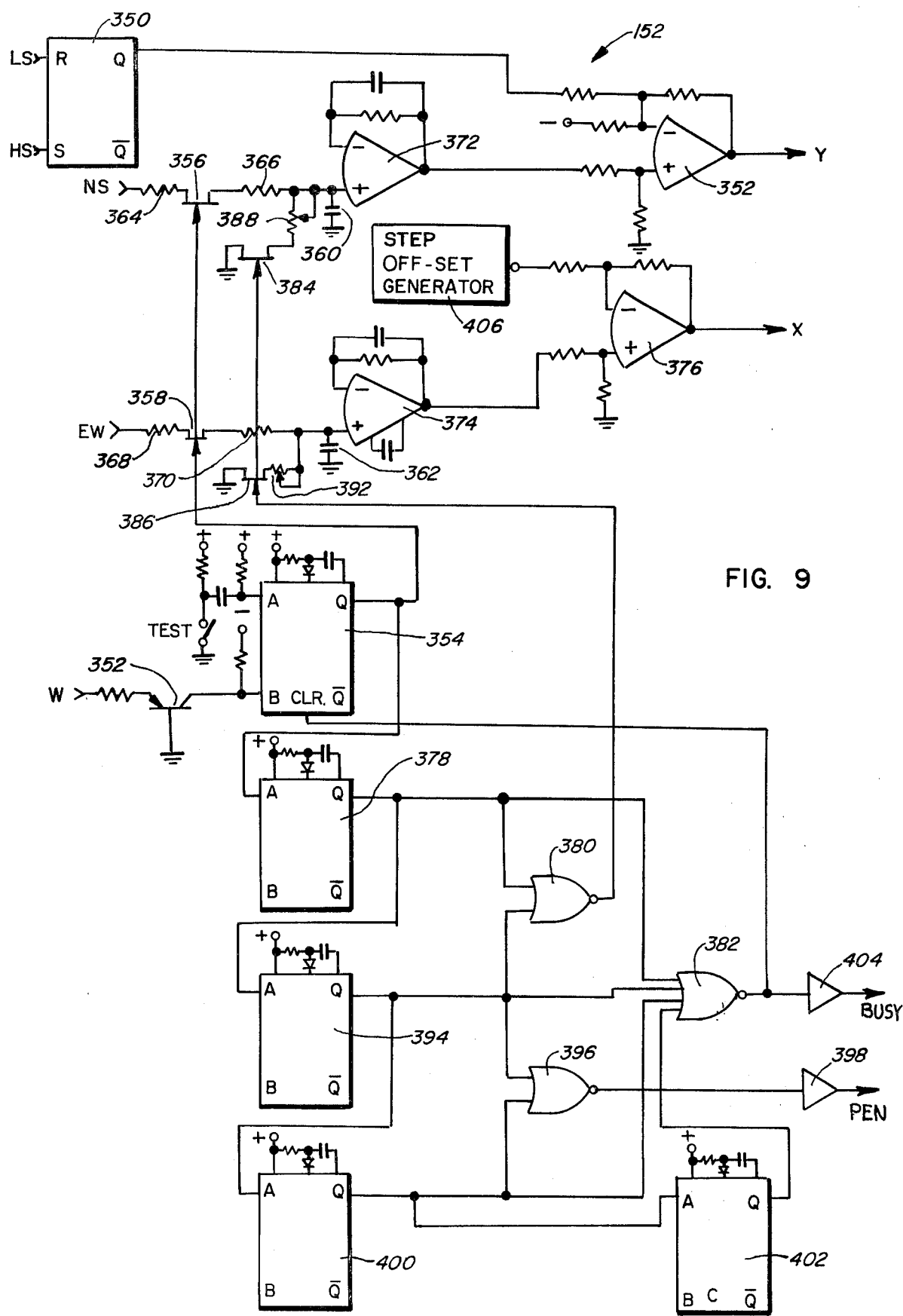
FIG. 9 is a detailed schematic diagram of the plotter control circuit of FIG. 5.

The plotter control circuit 152 (FIG. 9) accepts NS and EW signals from the logic circuits 143 and 144 via the micro-processor interface 148 (FIG. 5). The NS and EW signals may be applied to the plotter control circuit 152 by the logic circuits 143 and 144 via the micro-processor interface, or by the micro-processor 146 after being processed by the micro-processor 146.

The output of the plotter control 152 controls a plotter 150 such as, for example, the Hewlett-Packard 7041A high speed X-Y plotter. The plotter control circuit 152 generates X and Y signals that control the position of the pen in response to the received NS and EW signals as well as a pen lift signal that lifts and lowers the pen. When operating under micro-processor control, the length of the vector drawn by the plotter 150 will be proportional to the approximate range calculated by averaging the strokes in each flash, or if desired, to the strength of the received signal. If the plotter control is being controlled by the high gain or low gain logic circuits 143 and 144, the length of the vector will be proportional to the strength of the signals received by the antennas 132 and 134 and inversely proportional to range.

In the present embodiment, the outputs of the high gain and low gain logic circuits 143 and 144 will be plotted on two separate plots displaced vertically from each other, one for nearby discharges (low gain) and one for distant discharges (high gain).

When the plotter control 152 is being controlled directly by the outputs from the high gain and low gain logic circuits 143 and 144, the micro-processor interface 148 selects the output of either the high or low gain logic circuit 143 or 144. At the same time, the micro-processor interface 148 applies either an HS or an LS signal to a bistable multivibrator 350 (FIG. 9) within the plotter control 152 to indicate to the plotter control 152 whether the presently received signal is to be plotted with the high gain or low gain plots. The bistable multivibrator 350 generates either a high state or a low state signal in response to the HS or LS signal for application to an operational amplifier 352. The amplifier 352 responds to the high state or low state signal by providing a Y or vertical axis control signal to the plotter 150 to shift the output level of the operational amplifier 352 by a fixed increment to cause the plots of close and distant strokes to be plotted separately at vertically spaced intervals.

In accordance with an important aspect of the invention, the time that the plotter is writing is maintained constant but the writing speed and the maximum X and Y coordinates of each plot are controlled by either the strength of the received signal or by range data from the micro-processor 146. This has the advantage that it permits the range of a distant stroke (or signal strength of a strong stroke) to be determined by measuring the distance from the origin to one end of a plotted vector even if the other end of the vector is off scale, as will be discussed in a subsequent portion of the specification.

Whenever a write pulse W is generated by one of the high or low gain logic circuits 143 or 144, it is applied to the emitter of a transistor 352. The write pulse W may be applied to the transistor 352 either directly or via the micro-processor 146, and causes the transistor 352 to trigger a monostable multivibrator 354, such as, for example, a type CD4528AE monostable multivibrator manufactured by RCA. The triggering of the monostable multivibrator 354 causes the multivibrator 354 to generate a pulse that renders a pair of bilateral transmission gates 356 and 358 conductive to enable the bilateral transmission gates 356 and 358 to pass the respective NS and EW signals from the high gain or low gain analog circuits 136 or 138, or from the microprocessor 146, to a pair of respective sample storage capacitors 360 and 362 (via respective resistors 364, 366 and 368, 370). Consequently, the capacitors 360 and 362 are charged to a level determined by the strength of the respective NS and EW signals provided by the track and hold circuits of the analog circuits 136 and 138. The accumulated charges on the capacitors 360 and 362 result in voltages that are amplified by a pair of respective operational amplifiers 372 and 374, and applied to the Y coordinate amplifier 352 and to an X coordinate amplifier 376 to generate the X and Y control signals that drive the plotter 150. As a result, the pen of the plotter is driven to a point determined by the amplitudes of the NS and EW signals as reflected by the charge accumulated on the capacitors 360 and 362.

The monostable multivibrator 354 also triggers a second monostable multivibrator 378 that provides a time delay sufficient to permit the pen of the plotter to move to the point determined by the X and Y signals produced by the respective amplifiers 352 and 376. In addition, the Q output of the multivibrator 378 is coupled to a pair of NOR gates 380 and 382 and causes the NOR gates 380 and 382 to provide a low state signal each time the multivibrator 378 is triggered. The output signal from the NOR gate 382 serves to reset and inhibit the monostable multivibrator 354 and the output from the NOR gate 380 renders a pair of bilateral transmission gates 384 and 386 nonconductive thereby preventing the discharge of the capacitors 360 and 362 through the respective bilateral transmission gates 384 and 386 and the associated time constant defining resistors 388 and 392.

The timing out of the monostable multivibrator 378 triggers a pen dropping multivibrator 394 which provides a signal to the NOR gate 380 to maintain the bilateral transmission gates 384 and 386 nonconductive and simultaneously applies a signal to a NOR gate 396 to control an amplifier 398 which provides a pen control signal to the plotter 150 and causes the pen to contact the paper to initiate the recording operation.

The timing out of the pen control multivibrator 394 triggers a writing time monostable multivibrator 400 that causes the NOR gate 396 to continue to apply a signal to the amplifier 398 to maintain the pen in contact with the paper during the writing operation. The timing out of the pen control multivibrator 394 also removes the signal from the NOR gate 380, thereby causing the output of the NOR gate 380 to go high and to render the bilateral transmission gates 384 and 386 conductive to permit the capacitors 360 and 362 to discharge exponentially through the associated discharging resistors 388 and 392. As the capacitors 360 and 362 discharge, the Y and X signals from the amplifiers 352 and 376 cause the pen gradually to move toward the origin. The pen continues to write for the duration of the pulse provided by the write multivibrator 400, and after the write monostable multivibrator 400 times out, the signal is removed from the NOR gate 396, thereby causing the amplifier 398 to apply a signal to the plotter 150 to cause the plotter to raise the pen. The capacitors 360 and 362 continue to discharge until the pen reaches the origin; however, no mark is made on the paper after the write multivibrator 400 has timed out. A third delay multivibrator 402 is utilized to maintain the gate 382 operative to maintain the monostable multivibrator 354 in a reset and inhibited condition for a short time to prevent new signals from moving the pen before it has fully lifted from the paper. The output of the gate 382 is also coupled to an amplifier 404 that provides an indication that the plotter control circuit is busy during the entire writing operation.

The time that the pen is in contact with the paper is controlled by the multivibrator 400. This time is fixed regardless of the strength of the signal received by the apparatus, and the length of the recorded vector is determined by the initial charge on the capacitors 360 and 362. Consequently, the end of the vector farthest from the origin will be determined by the peak charge on the capacitors 360 and 362, and the end of the vector nearest the origin will be a fixed proportion of the distance to the farthest end with the proportion being determined by the discharge time constants of the capacitors 360 and 362 and associated circuitry. Consequently, since the distance between the origin and the end of the vector nearest the origin is a fixed proportion of the distance between the origin and the end of the vector farthest from the origin, if a signal of sufficient magnitude to generate such a large charge on the capacitors 360 and 362 so as to drive the plotter off scale is applied to the capacitors, the magnitude of the vector can still be determined by determining the distance between the origin and the end of the vector closest to the origin and applying the appropriate scaling factor.

Finally, in order to maximize the convenience to the operator, a step offset generator 406 forming part of the X-axis zero shift circuit 158 (FIG. 5) applies a stepped waveform to the amplifier 376. This causes a periodic incremental offset in the output of the amplifier 376 and causes the plot to be shifted periodically along the X axis so that several plots may be plotted at horizontally spaced intervals along the chart paper. This prevents previously recorded vectors from being obscured by subsequent vectors, and provides a series of plots that can readily be interpreted. The step offset generator may be any step generator that provides a stepped waveform having a time interval for example, 5 minutes to 4 hours between steps. The offset generator 406 may take the form of fully electronic circuitry, or may simply be fabricated from a clock motor that drives a stepping switch connected to a plurality of resistive dividers having their resistance ratios selected to provide the appropriate offset voltages.

Figure 12:
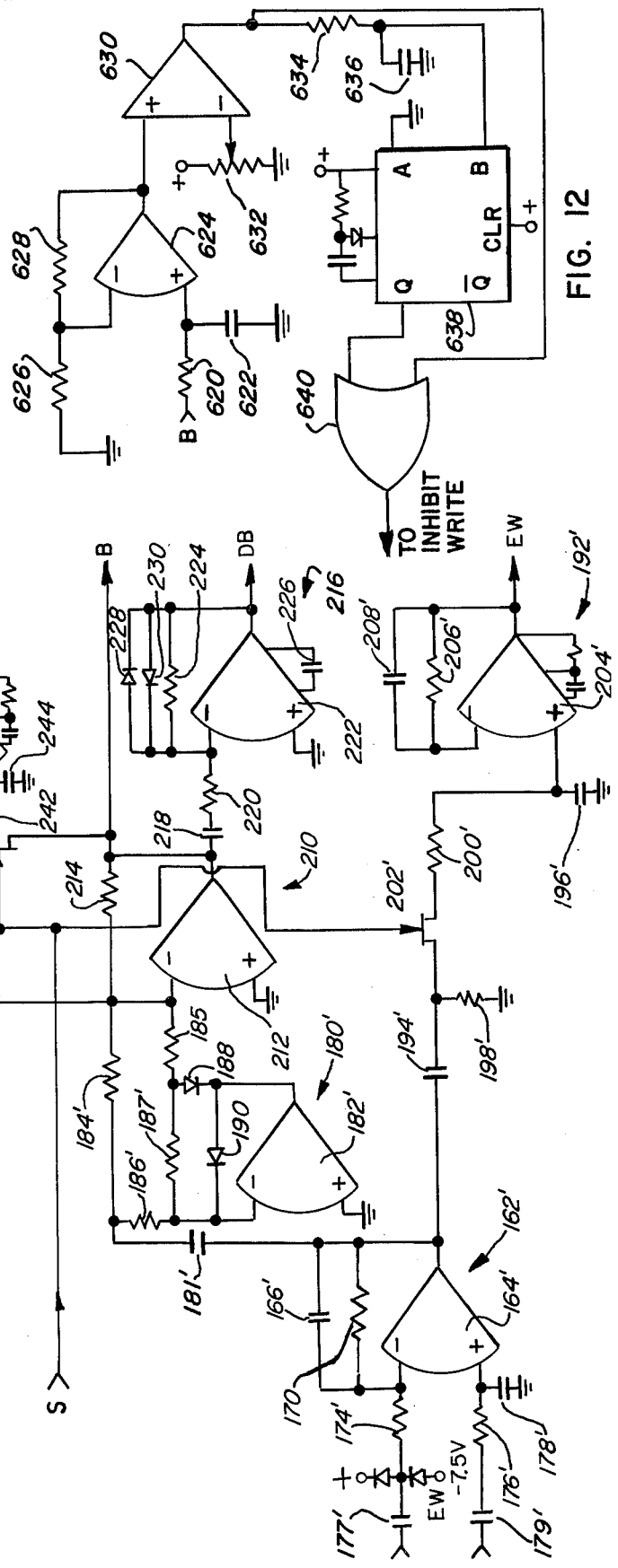
FIG. 12 is a schematic diagram of a circuit for rejecting signals produced by intracloud discharges.

An additional circuit (FIG. 12) can be added to better reject intracloud and other signals which have a change resemblance to lightning ground stroke signals. This circuit inhibits the formation of the WRITE pulse if any signal which fulfills the aforementioned logic requirements has been immediately preceded by other signals, as is often the case with intracloud and other types of unwanted signals.

The summed absolute value signal B is averaged by a resistor 620 and a capacitor 622 and this average signal is amplified by an operational amplifier 624 utilizing a feedback network comprising resistors 626 and 628. The comparator 630 generates an output signal when the averaged signal is greater than a threshold voltage set by a potentiometer 632. This signal is delayed by a delay network including a resistor 634 and a capacitor 636 and applied to a monostable multivibrator 638 to cause the monostable multivibrator 638 to generate a pulse. The output signal from either the comparator 630 or the monostable multivibrator 638 applied to one of the respective inputs of the OR gate 640 will cause the OR gate 640 to generate an output signal which will inhibit the monostable multivibrator 274 (FIG. 8) from generating a write pulse. Thus, the monostable multivibrator 274 will be prevented from generating a WRITE pulse whenever the summed absolute value signal B exceeds the threshold set by the potentiometer 632 and for a predetermined time interval thereafter determined by the width of the pulse from the monostable multivibrator 638.

VI. Micro-Processor Control

Figure 10:
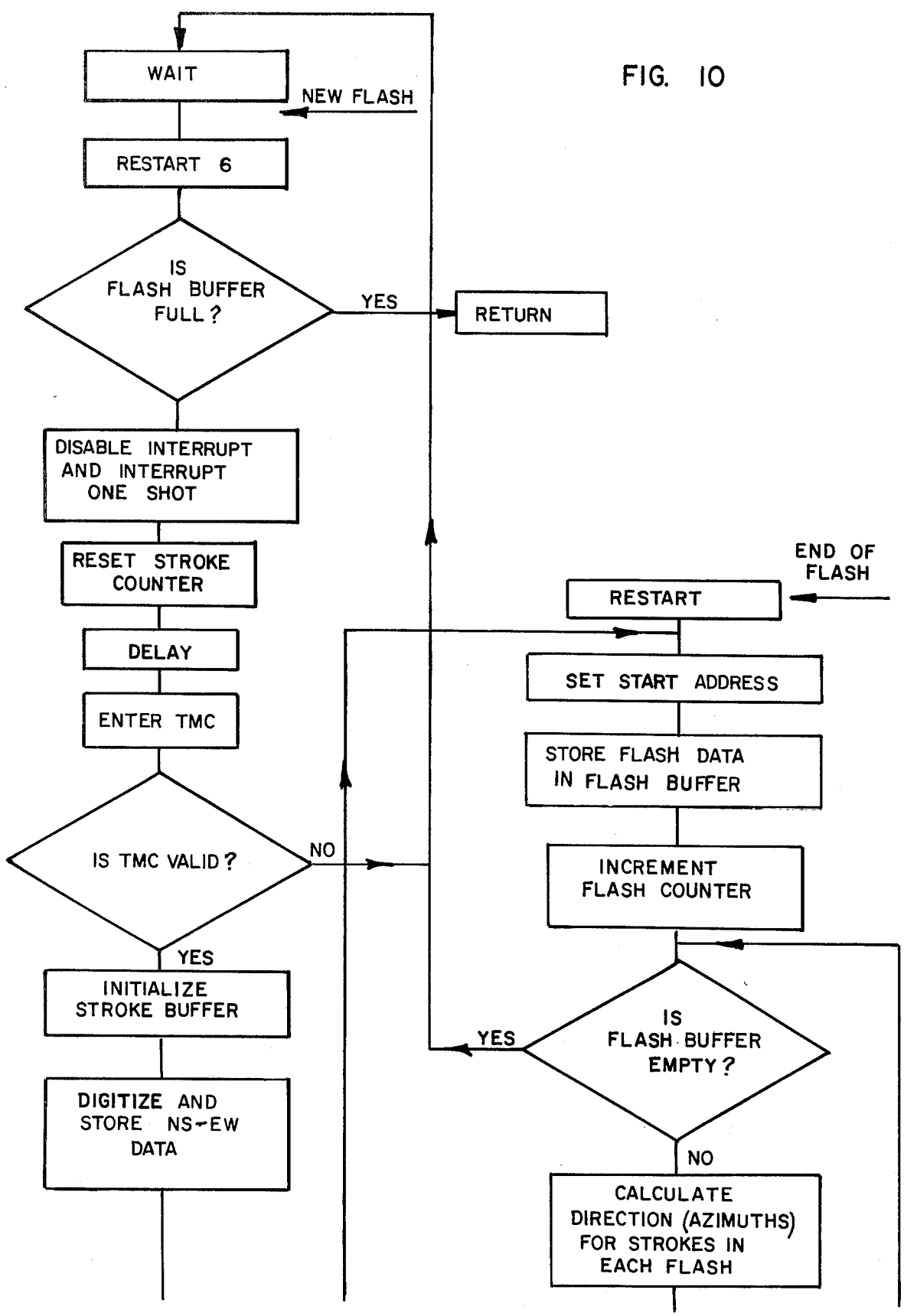
FIG. 10 is a flow chart of a program usable to control the micro-processor illustrated in FIG. 6.
Figure 10:
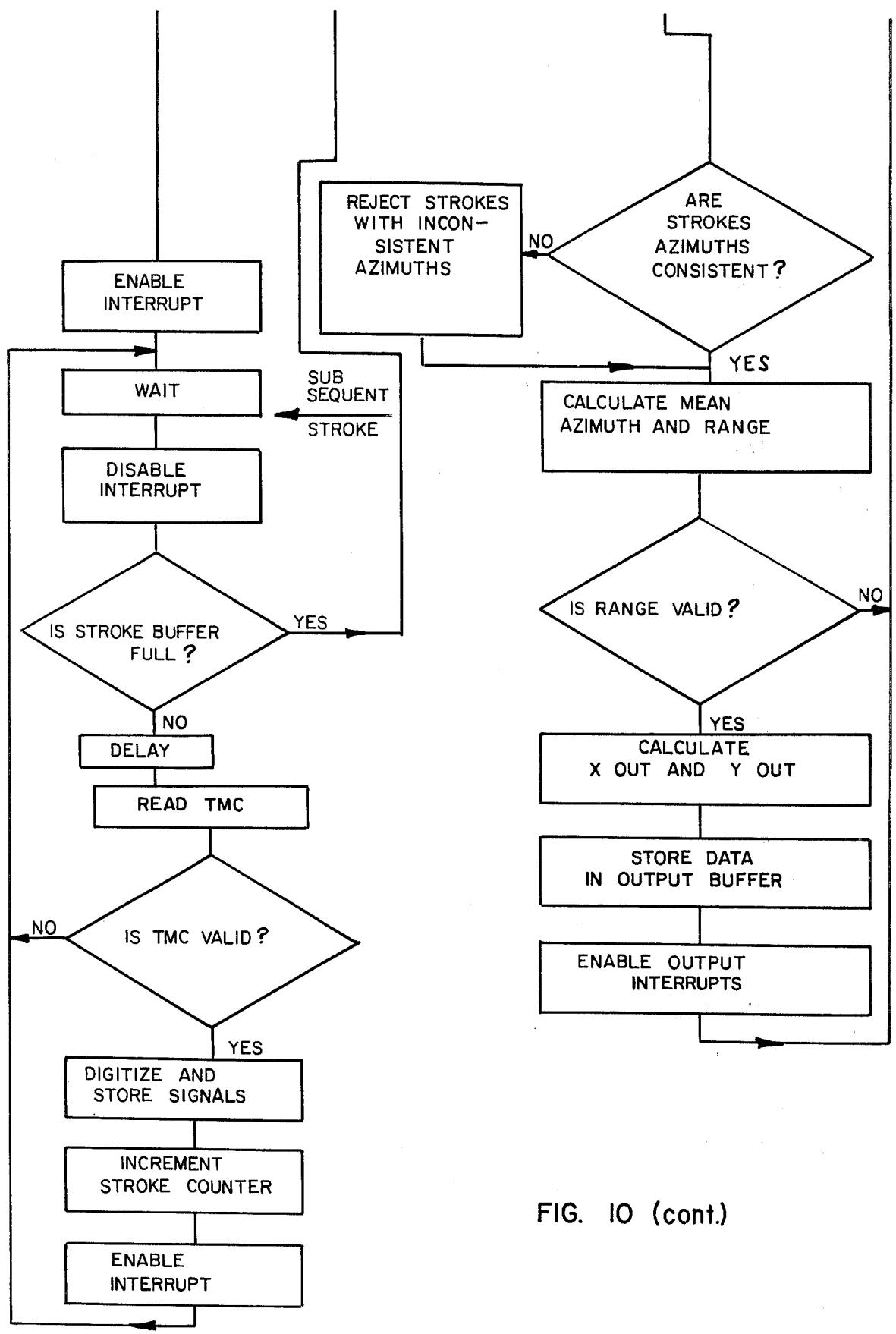

The system according to the invention as described in the foregoing will provide an accurate indication of the bearing and distance to a lightning stroke without the use of a micro-processor or a computer, however, the micro-processor 146 provides various additional useful features. For example, the micro-processor 146 digitizes, stores and makes available for further processing all data received and processed by the detection system. This permits all of the strokes in a flash to be analyzed for mutual consistency of azimuth, and permits all of the consistent azimuth readings in each flash to be averaged to provide an output having an azimuth that is the average of all of the strokes in the flash. Readings that are mutually inconsistent can be ignored and the overall accuracy of the system improved. In addition, the use of a micro-processor permits rapidly occurring flashes to be analyzed even though the flashes occur at a rate higher than the recording capability of the plotter 150. This is accomplished by storing the data for each flash, and plotting the data at a rate consistent with the speed of the plotter. Maximum and minimum azimuth readings can be outputted as can various trigger mode codes TMC, and the system can be made to analyze only strokes within a certain azimuth range or having a predetermined TMC code. This would permit a very detailed printout of each lightning flash giving information, such as, for example, the time of the flash, in hours, minutes and seconds; the number of strokes; the average azimuth of each stroke, the average signal strength or range of each stroke; and the TMC of each stroke. In addition, the micro-processor 146 can be programmed to alter the restrictions on the amplitude and position of the second peak, depending upon whether the stroke being analyzed is a first stroke or a subsequent stroke in a flash. Such a program can be written by an experienced programmer, and an example of a flow chart for a program embodying some of the above described features is illustrated in FIG. 10. Any number of other features can be provided by simply altering the program.

The program can also be made to accommodate data from several remote stations so that a more accurate indication of range can be obtained utilizing triangulation techniques. Such a system is illustrated in FIG. 11, and would be particularly useful for accurately pinpointing lightning strokes in urban, suburban and recreational areas, thus providing an advance warning of the occurrence of a potentially dangerous thunderstorm so that particularly vulnerable areas such as golf courses and beaches lying in the path of the storm may be evacuated. In a triangulating system such as the system illustrated in FIG. 11, two or more remotely located direction finder sites, such as the direction finder sites 500, 501 and 502 would be coupled to a central office 503 by respective communications links 504, 505 and 506. In the system illustrated in FIG. 11, the communications links 504–506 could be telephone lines, radio links, or the like, each having a bandwidth sufficient to transmit the information from the direction finder 500–502 to the central office 503. The equipment housed in the direction finder sites 500–502 would be similar to some of the equipment illustrated in FIGS. 4 and 5, such as the antennas 132 and 134, the high and low gain analog circuits 136 and 138, the high and low gain logic circuits 143 and 144 and a suitable micro-processor interface such as the micro-processor interface 148. The central office could, for example, utilize a micro-processor such as the micro-processor 146 and a plotter control circuit 152 and associated circuitry.

The micro-processor 146 would be programmed with the appropriate trigonometric functions necessary to determine the location of each lightning stroke by triangulation based on the direction information received from the remote direction finder sites 500–502. Ambiguities near the base-line connecting two stations can be resolved by comparing signal strengths at each station. The output of the plotter control circuit could then be used to drive one or more display units, for example, display units 507–509 each having a different display such as the plotter 150 or the X–Y oscilloscope 152. The displays 507–509 could be located at the same site as the central office 503, or could be remotely located and coupled to the central office 503 via a communications link such as a telephone line, radio link, or the like. If remote displays are utilized at remotely spaced geographic areas, only information relating to lightning strokes occurring in each respective geographic area need be displayed on each display. In such a system, a recreational area, such as, for example, a golf course could subscribe to a lightning detection service and have a remotely located display controlled by the central office 503, and the central office 503 could be programmed only to provide information relating to lightning strokes that might be potentially hazardous to the golf course. Other areas could utilize other remotely located displays, also controlled by the central office 503; however, the central office 503 would be programmed only to display lightning strokes in the vicinity of those areas such as those in the vicinity of a beach area. An automatic alarm system such as the alarm 510 could be utilized in conjunction with each of the displays to provide an audible or otherwise sensually perceptible alarm in the event that a lightning stroke occurs within a predetermined radius of the area to be protected.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A direction finder for determining the direction relative to said direction finder of lightning discharges to ground characterized by one or more strokes having a substantially vertical portion extending from the ground and one or more branches above the substantially vertical portion, said substantially vertical portion and said branches each producing a field, said direction finder comprising:
   means for detecting the field produced by a stroke; and
   means coupled to said detecting means and responsive only to the field generated by the substantially vertical portion of the stroke for generating an indication of the direction of said portion.

2. A direction finder as recited in claim 1 wherein said detecting means includes means for providing a signal representative of the detected field for application to said indication generating means, said system further including control means responsive to said detecting means for rendering said indication generating means responsive to only a predetermined initial portion of said detected field representative signal.

3. A direction finder as recited in claim 2 wherein said control means includes amplitude sensing means responsive to said detecting means for rendering said indication generating means responsive to said field representative signal only when the amplitude of said detected field exceeds a predetermined level.

4. A direction finder as recited in claim 3 wherein said control means includes means responsive to said detecting means for detecting an amplitude peak of said detected field, and means responsive to said peak detecting means for rendering said indication generating means responsive to said field representative signal only if said amplitude peak occurs within a predetermined time interval after said detected field has exceeded said predetermined level.

5. A direction finder as recited in claim 4, wherein said predetermined time interval is approximately 15 microseconds.

6. A direction finder as recited in claim 4, wherein said control means further includes means responsive to the amplitude of said detected field for rendering said indication generating means responsive to said field representative signal only if the amplitude of said field representative signal remains above a predetermined threshold for a second predetermined time interval.

7. A direction finder as recited in claim 6 wherein said predetermined threshold is equal to said predetermined level.

8. A direction finder as recited in claim 7 wherein said second predetermined time interval is in the range of approximately 0–50 microseconds.

9. A direction finder as recited in claim 7 wherein said predetermined threshold is variable.

10. A direction finder as recited in claim 4 further including means responsive to a second amplitude peak of said detected field for rendering said indication generating means responsive to said field representative signal only if said second peak occurs within a predetermined range of time intervals following said amplitude peak.

11. A direction finder as recited in claim 10 wherein said predetermined range of time intervals is approximately 5–17 microseconds.

12. A direction finder as recited in claim 4 further including means for comparing the amplitudes of said first and any subsequent peaks and for rendering said indication generating means responsive to said field representative signal only if every said subsequent peak has a lesser amplitude than said amplitude peak.

13. A direction finder as recited in claim 3 wherein said control means includes means for rendering said indication generating means responsive to said field representative signal only if the amplitude of said detected field has remained below a predetermined threshold for a predetermined time interval prior to exceeding said predetermined level.

14. A direction finder as recited in claim 1 further including second means geographically spaced from said detecting means for detecting the field produced by said stroke, second means coupled to said second detecting means and responsive only to the field generated by the relatively straight, substantially vertical portion of the stroke for generating a second indication of the direction of said portion, and means responsive to said first and second indications for generating an indication of the location of said discharge.

15. A direction finder as recited in claim 1 wherein said lightning discharge comprises a plurality of component strokes, and wherein said detecting means and said indication generating means are responsive to said component strokes for generating an indication of the direction of each of said component strokes, wherein said direction finder further includes means responsive to each of said indications for providing an average indication of the direction of said portion.

16. A direction finder as recited in claim 1 further including means responsive to the amplitude of the field produced by a lightning discharge for determining the distance between said direction finder and said lightning discharge.

17. A direction finder as recited in claim 1 wherein said field is a magnetic field.

18. A direction finder for determining the direction relative to said direction finder of lightning discharges to ground having one or more component strokes comprising:
  means responsive to orthogonal components of the field produced by a lightning discharge for generating electrical signals having waveforms representative of the orthogonal components of the field produced by at least one of said component strokes; and
  means responsive only to the portions of the waveforms of said orthogonal components representative of the initial portion of one of said strokes for determining the direction of said discharge.

19. A direction finder as recited in claim 18 wherein said direction determining means includes means responsive to the amplitude of said field for rendering said direction determining means responsive to said waveforms of said orthogonal components only for a predetermined time interval after the amplitude of said field exceeds a predetermined level to thereby render said direction determining means responsive to only said portions of said waveforms of said orthogonal components representative of the initial portion of one of said strokes.

20. A direction finder as recited in claim 19 wherein said means for rendering said direction determining means responsive to said waveforms of said orthogonal components includes means for determining the peak of said field and means for rendering said direction determining means responsive to said waveforms only if said peak occurs within said predetermined time interval.

21. A direction finder as recited in claim 20 wherein said means for rendering said direction determining means responsive to said waveforms of said orthogonal components includes means for rendering said direction determining means responsive to said waveforms only if the amplitude of said field exceeds said predetermined level for a predetermined minimum time duration.

22. A direction finder as recited in claim 21 wherein said means for rendering said direction determining means responsive to said waveforms of said orthogonal components includes means for rendering said direction determining means responsive to said waveform only if the amplitude of said field has remained below a predetermined threshold for a predetermined time interval prior to exceeding said predetermined level.

23. A direction finder as recited in claim 21 wherein said peak determining means further includes for determining the occurrence of a second peak of said field and for rendering said direction determining means responsive to said waveforms only if said second peak has a predetermined amplitude and time relationship to said first peak.

24. A direction finder as recited in claim 19 wherein said electrical signal generating means includes first and second antennas disposed for receiving orthogonal components of said field, means connected to each of said antennas for providing electrical signals each having a waveform representative of one of the received orthogonal components and means coupled to said orthogonal component representative signal providing means for combining said orthogonal component representative waveforms for providing a combined waveform, said field amplitude responsive means being responsive to said combined waveform for rendering said direction determining means responsive to the portions of said waveforms of said orthogonal components representative of the initial portion of one of said strokes.

25. A direction finder as recited in claim 24 wherein said electrical signal providing means includes first means responsive to strong fields and second means responsive to weak fields.

26. A direction finder as recited in claim 18 wherein said direction determining means includes means for generating a visual indication of the direction of said discharge and the distance to said discharge, said visual indication including a vector having a length representative of the distance to said discharge and extending in a direction representative of the direction of said discharge, means for controlling the generation of said vector including means for initiating and terminating the generation of said vector, said generation initiating and terminating means including timing means for providing a fixed time interval between the initiation and termination of the generation of each vector, and means for controlling the rate of generation of said vector to thereby generate variable length vectors within said fixed time intervals.

27. A direction finder as recited in claim 26 wherein said vector generation controlling means includes means responsive to the amplitude of said waveform for generating a signal defining one end of said vector, and means for providing a signal proportional to said signal defining said one end of said vector to thereby define a second end of said vector.

28. A direction finder as recited in claim 27 wherein said proportional signal providing means includes a resistor and a capacitor, wherein said capacitor is operatively coupled to said waveform generating means for receiving a charge thereon representative of the amplitude of said waveform, said resistor being operative to discharge said capacitor at a predetermined rate to generate said proportional signal at the end of said fixed time interval.

29. A lightning detection system comprising:
means responsive to the field produced by a lightning discharge for generating an electrical signal having a waveform representative of said field; and
means for analyzing the shape of said waveform and providing a signal indicative of a lightning discharge to ground only when the shape of said waveform has a predetermined characteristic, wherein said analyzing means includes:
means responsive to said electrical signal for providing an enabling signal to said system when said waveform exceeds a predetermined level;
means responsive to said electrical signal for detecting a peak of said waveform and providing a peak indicative signal in response thereto; and
means operatively coupled to said enabling signal providing means and to said peak detecting means for providing a signal indicative of a lightning discharge to ground when said peak indicative signal occurs within a predetermined time interval following the generation of said enabling signal.

30. A lightning detection system as recited in claim 29 wherein said analyzing means includes means for providing said enabling signal only if said waveform has remained below a predetermined threshold for a predetermined time interval prior to exceeding said predetermined level.

31. A lightning detection system as recited in claim 29 wherein said analyzing means further includes means operatively coupled to said enabling signal providing means and to said lightning discharge to ground signal providing means for rendering said lightning discharge to ground signal providing means operative to provide said signal indicative of a lightning discharge to ground only when said enabling signal persists for a predetermined period of time.

32. A lightning detection system as recited in claim 31 further including long width indicative means operatively coupled to said enabling signal providing means for providing a long width signal when said enabling signal persists more than said predetermined time.

33. A lightning detection system as recited in claim 29 further including means coupled to said peak detecting means for rendering said lightning discharge to ground signal providing means operative to provide said indication of a lightning discharge to ground upon the detection of a second peak only when said second peak occurs within a predetermined time interval following the detection of said first peak.

34. A lightning detection system as recited in claim 33 further including amplitude comparing means responsive to said peak detecting means for comparing the amplitudes of said peak and said second peak and for providing an output signal only when said second peak has a lower amplitude than the amplitude of said first peak.

35. The method of determining, relative to a point of observation, the direction of a lightning discharge to ground characterized by one or more strokes having a substantially vertical portion extending from the ground and one or more branches above the substantially vertical portion, comprising the steps of:
detecting at said point of observation the field produced by a lightning discharge to ground; and
utilizing only the portion of the field produced by the substantially vertical portion of the discharge to obtain an indication of the direction to the lightning discharge.

36. The method recited in claim 35 further including the steps of detecting the field produced by said lightning discharge to ground at a second geographical location, utilizing the portion of the field produced by the substantially vertical portion of the discharge detected at said second geographical location to provide a more accurate indication of the location of said lightning discharge.

37. The method of measuring the direction, relative to a point of observation, of a lightning discharge to ground characterized by one or more strokes having a substantially vertical portion extending from the ground and one or more branches comprising the steps of:
detecting at said point of observation orthogonal components of the field produced by a lightning discharge;
generating electrical signals having waveforms representative of the orthogonal components of said field; and
utilizing only the portions of the waveforms of the orthogonal components representative of the initial portion of one of said strokes for determining the direction of said discharge.

38. The method recited in claim 37 further including the steps of detecting the field produced by said lightning discharge at a second geographical location, generating a second electrical signal having a waveform representative of the field detected at said second geographical location, and utilizing the portions of the waveforms of the orthogonal components representative of the initial portion of one of said strokes detected at said location in conjunction with said portion of said waveforms of the orthogonal components representative of the initial portion of one of said strokes detected at said point of observation for determining the location of said discharge.

39. The method recited in claim 37 wherein the step of utilizing only the portions of said waveforms of said orthogonal components representative of the initial portion of one of said strokes includes the steps of generating an electrical signal representative of the magnitude of said field, determining when the magnitude of said field magnitude representative signal exceeds a predetermined level and utilizing said waveforms of said orthogonal components for determining the direction of said discharge only after the magnitude of said field magnitude representative signal has exceeded said predetermined level and remained above said predetermined level for a predetermined time interval.

40. The method recited in claim 39 further including the step of determining when the magnitude of said field magnitude representative signal is below a predetermined threshold and utilizing said waveforms of said orthogonal components for determining the direction of said discharge only if the magnitude of said field magnitude representative signal has remained below said predetermined threshold for a predetermined time interval prior to exceeding said predetermined level.

41. The method recited in claim 39 wherein the step of utilizing only the portions of the waveforms of the orthogonal components representative of the initial portion of one of said strokes for determining the direction of said discharge includes the steps of detecting the peak of said field magnitude representative signal and sampling said waveforms of the orthogonal components at the time of occurrence of said peak only if said peak occurs within a predetermined time interval after the amplitude of the field magnitude representative signal exceeds said predetermined level.

42. The method recited in claim 41 further including the step of detecting a second peak of said field magnitude representative signal and utilizing the portions of the waveforms of the orthogonal components for determining the direction of said discharge only if said second peak occurs within a predetermined time interval subsequent to the detection of said peak.

43. The method recited in claim 42 further including the steps of comparing the amplitudes of said first peak and any subsequent peaks, and utilizing only the initial portions of the waveforms of the orthogonal components representative of the initial portion of one of said strokes for determining the direction of said discharge only when each said subsequent peak has a smaller amplitude than the amplitude of said peak.

44. The method recited in claim 37 wherein each discharge comprises a plurality of component strokes further including the steps of detecting the field produced at said point of observation by each of said strokes, generating electrical signals having waveforms representative of orthongonal components of the field produced by each stroke, utilizing the portions of each waveform representative of the initial portion of each component stroke for determining the direction of each stroke, and averaging the directions thus determined for each stroke to determine the direction of said discharge.

45. The method recited in claim 41 further including the step of disregarding the direction determined for each stroke that does not correlate with the direction determined for the other strokes.

46. The method recited in claim 37 wherein the method of detecting the orthogonal components of the field produced by a lightning discharge includes the steps of detecting orthogonal components of the magnetic field produced by the lightning discharge.

47. The method recited in claim 37 further including the steps of generating a vector representative of the direction and range of said discharge, said vector generating step including the step of writing said vector in a fixed time period and varying the writing speed in a manner proportional to the range of the discharge to generate variable length vectors having first and second ends with the distance to said first end defining the range of said discharge and the distance to said second end being proportional to the distance to said first end, the distance to said second end thereby also defining the distance to said discharge when multiplied by a proportionality constant.

48. The method of classifying lightning discharges comprising the steps of:
    detecting the field produced by a lightning discharge;
    generating an electrical signal having a waveform representative of said field; and
    analyzing the shape of said waveform and providing an indication of a lightning discharge to ground when the shape of the waveform has a predetermined characteristic, wherein the step of analyzing the shape of said waveform includes the steps of:
    sensing the amplitude of said waveform,
    determining when the amplitude of said waveform exceeds a predetermined level,
    determining the peak of said waveform, and providing said indication of a lightning discharge to ground only if said waveform reaches its peak before the end of a predetermined time interval after the waveform exceeds said predetermined level.

49. The method recited in claim 48 wherein the step of analyzing the shape of said waveform includes the step of determining the amplitude of said waveform and providing said indication of a lightning discharge to ground only when the amplitude of said waveform remains below a predetermined threshold for a predetermined time interval prior to exceeding said predetermined level.

50. The method recited in claim 48 wherein the step of analyzing the shape of said waveform includes the step of determining the time interval said waveform exceeds a predetermined threshold and providing said indication of a lightning discharge to ground only when said waveform remains above said predetermined threshold for longer than a second predetermined time interval.

51. The method recited in claim 50 wherein said predetermined threshold is equal to said predetermined level.

52. The method recited in claim 48 wherein the step of analyzing the shape of said waveform further includes the step of detecting the existence of a second peak, and upon the detection of said second peak, providing said indication of a lightning discharge to ground only if said second peak occurs within a predetermined range of times following the occurrence of said peak.

53. The method recited in claim 48 wherein the step of analyzing the shape of said waveform further includes the step of comparing the amplitudes of said peak and any subsequent peak and providing said indication of a lightning discharge to ground only if the amplitude of said peak is greater than the amplitude of said subsequent peak.

54. A lightning detection system comprising:
    means for detecting the field produced by a lightning discharge and for providing signals representative of the amplitude and direction of said field relative to said system;
    means for sampling portions of said signals and providing representations of said sampled portions
    means for utilizing said representations to generate an indication of the direction of said discharge relative to said system;
    means operatively coupled to said detecting means and to said sampling means for sensing the amplitude of said field and for rendering said sampling means operative to sample said portions of said signals only after the amplitude of said field exceeds a predetermined level, wherein said amplitude sensing means includes means for detecting the peak of said field and for rendering said sampling means operative to sample said signals upon the occurrence of said peak.

55. A lightning detection system as recited in claim 54 further including means operatively coupled to said detecting means and to said sampling means for rendering said sampling means operative to sample said waveform only if the amplitude of said waveform has remained below a predetermined threshold for a predetermined time interval prior to exceeding said predetermined level.

56. A lightning detection system as recited in claim 54 further including means for preventing the generation of said direction indication unless said peak occurs within a predetermined range of times after the amplitude of said field exceeds said predetermined level.

57. A lightning detection system as recited in claim 56 further including means for inhibiting the generation of said indication unless the amplitude of said field remains above said predetermined level for a predetermined length of time.

58. A lightning detection system as recited in claim 54 wherein said field detecting means includes means for detecting first and second orthogonal components of said field and for providing first and second signals having first and second respective waveforms each representative of one of the orthogonal components of said field, wherein said sampling means includes means for sampling portions of said first and second signals and for providing first and second representations of said first and second respective sampled portions of said waveforms, and wherein said utilizing means is responsive to said first and second representations for generating an indication of the direction of said discharge relative to said system.

59. A lightning discharge detection system as recited in claim 58 wherein said sampling means includes means for storing said first and second representations.

60. A lightning detection system as recited in claim 58 wherein said detecting means includes means for combining said first and second signals to generate a combined signal having a waveform representative of the amplitude of said field, and said amplitude sensing means includes means responsive to said combined signal for rendering said sampling means operative to sample said first and second signals after the amplitude of said combined signal exceeds a predetermined level.

61. A lightning detection system as recited in claim 60 wherein said amplitude sensing means includes means responsive to said combined signal for rendering said sampling means operative to sample said first and second signals only if the amplitude of said combined signal has remained below a predetermined threshold for a predetermined time interval prior to exceeding said predetermined level.

62. A lightning detection system as recited in claim 60 further including means responsive to said combined signal for providing an indication of the peak of said combined signal, said sampling means being responsive to said peak indication for sampling said first and second signals upon the occurrence of said peak indication.

63. A lightning detection system as recited in claim 62 further including means responsive to said peak indication for rendering said utilizing means nonresponsive to said first and second signals unless said peak indication occurs within a predetermined range of times after the amplitude of said combined signal has exceeded said predetermined level.

64. A lightning detection system as recited in claim 62 further including means responsive to said combined signal for rendering said utilizing means nonresponsive to said first and second signals unless the amplitude of said combined signal remains above said threshold for a predetermined minimum time interval.

65. A direction finder as recited in claim 4 wherein said control means includes means responsive to said amplitude peak detecting means for rendering said indication generating means responsive only to the portion of said detected field representative signal immediately following said amplitude peak.

66. A direction finder as recited in claim 4 wherein said field detecting means includes an antenna.

67. A direction finder as recited in claim 66 wherein said antenna includes a magnetic field detecting antenna.

68. A direction finder as recited in claim 20 wherein said peak determining means includes means for rendering said direction determining means responsive only to those portions of the waveforms of said orthogonal components immediately following the occurrence of said peak.

69. A direction finder as recited in claim 20 wherein said peak determining means includes means for rendering said direction determining means responsive to the peak of the waveforms of said orthogonal components that occur concurrently with said peak of said field.

70. A direction finder as recited in claim 20 wherein said predetermined time interval is approximately 15 microseconds.

71. A direction finder as recited in claim 21 wherein said predetermined minimum time duration is in the range of approximately 0–50 microseconds.

72. A direction finder as recited in claim 23 wherein said predetermined time relationship is such that said second amplitude peak follows said first amplitude peak by approximately 5–17 microseconds.

73. A lightning detection system as recited in claim 29 wherein said predetermined time interval is approximately 15 microseconds.

74. A lightning detection system as recited in claim 31 wherein said predetermined period of time is in the range of approximately 0–50 microseconds.

75. A lightning detection system as recited in claim 33 wherein said predetermined time interval following the detection of said first peak is in the range of approximately 5–17 microseconds.

76. A direction finder as recited in claim 18 wherein said orthogonal component responsive means include means responsive to orthogonal components of a magnetic field.

77. The method recited in claim 48 wherein said predetermined time interval is on the order of approximately 15 microseconds.

78. The method recited in claim 50 wherein said second predetermined time interval is in the range of approximately 0–50 microseconds.

79. The method recited in claim 52 wherein said predetermined range of time following the occurrence of said peak is in the range of approximately 5–17 microseconds.

80. The method recited in claim 48 wherein the step of detecting the field produced by a lightning discharge includes the step of detecting a magnetic field.

81. A lightning detection system as recited in claim 54 wherein said preventing means includes means for preventing the generation of said direction indication unless said peak occurs within approximately 15 microseconds after the amplitude of said field exceeds said predetermined level.

82. A lightning detection system as recited in claim 57 wherein said inhibiting means includes means in inhibiting the generation of said indication unless the amplitude of said field remains above said predetermined level for a time interval in the range of approximately 0-50 microseconds.

* * * * *

REEXAMINATION CERTIFICATE (609th)
United States Patent [19]
Krider et al.

[11] B1 4,115,732
[45] Certificate Issued  Dec. 30, 1986

[54] DETECTION SYSTEM FOR LIGHTNING

[75] Inventors: Edmund P. Krider; Ralph C. Noggle, both of Tucson, Ariz.; Martin A. Uman, Gainesville, Fla.

[73] Assignee: The University of Arizona Foundation, Tucson, Ariz.

Reexamination Request:
No. 90/000,951, Feb. 5, 1986

Reexamination Certificate for:
Patent No.: 4,115,732
Issued: Sep. 19, 1978
Appl. No.: 732,365
Filed: Oct. 14, 1976

[51] Int. Cl.[4] .......................................... G01R 31/02
[52] U.S. Cl. ................................... 324/72; 324/77 R
[58] Field of Search ...................... 324/72, 72.5, 77 R, 324/77 A; 340/601; 73/170 R

[56] References Cited
U.S. PATENT DOCUMENTS

| | | | |
|---|---|---|---|
| 3,437,833 | 4/1969 | Razaitis | 328/115 |
| 3,467,826 | 9/1969 | Cotterman | 250/336.1 |
| 3,524,984 | 8/1970 | Fothergill | 250/336.1 |
| 4,219,804 | 8/1980 | Weischedel | 340/600 |

OTHER PUBLICATIONS

L. Ruhnke, "A Three-Station Lightning Detection System," NOAA Tech. Rpt. 239-APCL 23, Jul. 1972, pp. 1-5.

Latham, "A Proposal For Lightning Detection and Location," (RML) Patrick Air Force Base, Fla., Jan. 74, pp. 1-0 to 1-2, A1-A7.

FAA Proposal, "Lightning Position And Tracking System", Atlantic Science Corp., Indilantio, Fla., pp. 1-6.

*Primary Examiner*—M. Tokar

[57] ABSTRACT

A lightning detection system utilizes a gated magnetic direction finder for determining the range and direction of lightning discharges to ground. Logic circuitry is provided for controlling gating circuits within the direction finder so that the direction measurement is made during the initial few microseconds of the return stroke waveform, thereby minimizing errors caused by non-vertical lightning channels to ground, branches and intracloud discharges. Distance measurements are made by analyzing the amplitude of the detected return stroke waveform, or by utilizing two or more geographically separated direction finders and triangulation techniques. The waveforms of the signals received by the direction finder are analyzed to determine whether the discharge is ground stroke or another type of discharge, or background noise. Further circuitry can be used to distinguish between various types of ground strokes, such as first strokes or subsequent strokes in a flash.

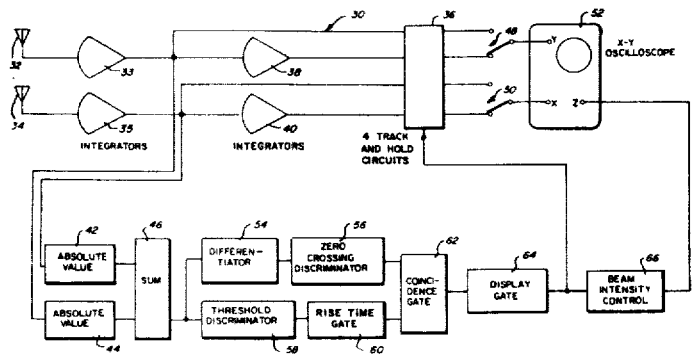

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-82 is confirmed.

* * * * *